(12) United States Patent
Wu et al.

(10) Patent No.: US 6,492,069 B1
(45) Date of Patent: Dec. 10, 2002

(54) METHOD FOR FORMING AN ATTENUATED PHASE-SHIFTING MASK

(75) Inventors: Ching-Liang Wu, Hsinchu (TW);
Yueh-Lin Chou, Taichung (TW);
Jen-Hui Tseng, Changhua (TW)

(73) Assignee: Worldwide Semiconductor Manufacturing Corp. (TW)

( * ) Notice: Subject to any disclaimer, the term of this patent is extended or adjusted under 35 U.S.C. 154(b) by 0 days.

(21) Appl. No.: 09/534,171

(22) Filed: Mar. 24, 2000

(30) Foreign Application Priority Data

Mar. 10, 2000 (TW) ........................ 89104447 A

(51) Int. Cl.[7] ............... G03F 9/00; G03C 5/00
(52) U.S. Cl. .................. 430/5; 430/322; 430/323; 430/324
(58) Field of Search ................ 430/5, 322, 323, 430/324

(56) References Cited

U.S. PATENT DOCUMENTS 5,589,303 A  * 12/1996 DeMarco .................. 430/5

* cited by examiner

Primary Examiner—Christopher G. Young
Assistant Examiner—Saleha R. Mohamedulla

(57) ABSTRACT

This invention discloses a method for forming an attenuated phase-shifting mask, including following steps. A transparent plate is provided, on which a phase-shifting layer, opaque layer, and undeveloped photoresist layer being stacked on the transparent plate successively. A first part of the photoresist layer is removed until exposing a first region of the opaque layer. The first region of the opaque layer is removed for exposing parts of the phase-shifting layer. A second part of the photoresist layer is removed for exposing a second region of the opaque layer. The exposed phase-shifting layer is then etched by employing the opaque layer as an etching mask. Then the exposed opaque layer and photoresist layer are successively remove, thus forming a complete attenuated phase-shifting mask.

18 Claims, 5 Drawing Sheets

METHOD FOR FORMING AN ATTENUATED PHASE-SHIFTING MASK

FIELD OF THE INVENTION

This invention relates to a method of forming a mask for photolithography, and more particularly to a method for forming an attenuated phase-shifting mask (PSM).

BACKGROUND OF THE INVENTION

An attenuated phase-shifting mask (PSM), a widely used mask in photolithography, is mainly fabricated by coating a phase-shifting layer upon on a transparent plate, thus to interfere the phase of light incident through the transparent plate for providing a better exposure accuracy during the photolithography. As a result of the better exposure accuracy, patterns of attenuated phase-shifting mask would be transformed onto chips more accurate than those of conventional mask do. Typically, a stepper, a machine for projecting rays through masks onto chips during photolithography, identifies and locates a mask by detecting reflected ray form bar codes and position marks at edges of the mask. However, the stepper doesn't always successfully identify and locate attenuated phase-shifting masks, since a great amount of incident light would pass through the phase-shifting layer so as provide insufficient amount of reflected ray for identifying and locating them. Moreover, patterns of chips transformed form edges of the phase-shifting layer might be exposed in overlap after the use of several attenuated phase-shifting masks. The photoresist layer of those patterns will undesirably lose due to the overlapped exposures, thereby damaging the accuracy of patterns of chips.

For overcoming the above mentioned problems of applying attenuated phase-shifting mask, many semiconductor manufacturers coat an opaque layer around its edges for facilitating steppers to identify and locate the attenuated phase-shifting mask by the reflected ray from the opaque layer at the edges. Referring to FIG. 1, an attenuated phase-shifting mask 34 is coated with a opaque layer 38 around the central image field 36, which includes patterns formed by a phase-shifting layer coated on a transparent plate. Due to the opaque layer 38, a stepper is able to detect the reflected ray from the bar code 40 and position marks 42 to identify and locate the attenuated phase-shifting mask 34.

Through FIG. 2 to FIG. 8, a conventional process for fabricating an attenuated phase-shifting mask with the opaque layer in semiconductor manufacturer's plant is shown. FIG. 2 shows a cross-sectional view of an attenuated phase-shifting mask 44 provided by mask vendors. The attenuated phase-shifting layer 44 is formed by successively coating a phase-shifting layer 48, opaque layer 50, and first photoresist layer 52 on a transparent plate 46. In order to form patterns on the attenuated phase-shifting mask 44, the first photoresist layer is defined as shown in FIG. 3 by exposure and development. Referring to FIG. 3, parts of the opaque layer 50 are then stripped through a conventional etching process by employing the photoresist layer 52 as an etching mask. Then the photoresist layer 52 is totally stripped thus to shape the cross-sectional view of FIG. 4. Using the opaque layer 50 as an etching mask, parts of the phase-shifting layer 48 are removed until exposing the surface of transparent plate 46, as shown in FIG. 5.

Referring to FIG. 6, a second photoresist layer 54 is blanketed over the transparent plate 46. Through steps of exposure and development, the second photoresist layer 54 is partially removed as the cross-sectional view shown in FIG. 7. Parts of the opaque layer 50 exposed out of the second photoresist layer 54 are stripped through an etching process by employing the second photoresist layer 54 as an etching mask, then removing the second photoresist layer 54 to complete the attenuated phase-shifting mask 44, as shown in FIG. 8. As a result of the opaque layer 50 around upon the phase-shifting layer 48 and transparent layer 46, the stepper may correctly identify and located the attenuated phase-shifting mask 44 by detecting reflected rays from the opaque layer 50.

Although this conventional process enables semiconductor manufacturers to fabricate an attenuated phase-shifting mask with an opaque layer, it exists some shortcomings. This conventional process is much complicated, since it needs to an extra photoresist layer, namely the aforementioned second photoresist layer. For forming the extra photoresist layer, the semiconductor manufacturers need to coat second photoresist layer on a original mask, which already has a first photoresist layer provided by mask vendors. Because of the square shape of mask, it's hard to coat the second photoresist layer uniformly as its corners by semiconductor manufacturers themselves. Therefore, under this conventional process, the semiconductor manufacturers suffer low yield rates and high costs from it.

In brief, for forming an opaque layer around an attenuated phase-shifting mask as well as avoiding the low yield and cost due to the conventional process, there is huge need to improve the conventional process to overcome the above problems.

SUMMARY OF THE INVENTION

An objective of this invention is to provide semiconductor manufacturers a simplified method to from an attenuated phase-shifting mask.

This invention discloses a method for forming an attenuated phase-shifting mask, including following steps. A transparent plate is provided, on which a phase-shifting layer, opaque layer, and undeveloped photoresist layer being stacked on the transparent plate successively. A first part of the photoresist layer is removed until exposing a first region of the opaque layer through exposure and development processes. The first region of the opaque layer is removed for exposing parts of the phase-shifting layer. A solidified thin surface of the photoresist layer is stripped by low-energy plasma treatment. A second part of the photoresist layer is removed for exposing a second region of the opaque layer through exposure and development processes. The exposed phase-shifting layer is then etched by employing the opaque layer as an etching mask. Then the exposed opaque layer and photoresist layer are successively remove, thus forming a complete attenuated phase-shifting mask.

DETAILED DESCRIPTION OF THE PREFERRED EMBODIMENT

This invention proposes a method for forming an attenuated phase-shifting mask with an opaque layer around it form an original mask the mask venders provide. This method uses only one photoresist layer, which is inherently provided by mask venders, to form an opaque layer by a step of treating the surface of the photoresist layer. By avoiding extra exposure and development, this method overcomes the problems of low yield and high cost in the conventional process. For illustrating the invention clearly, a preferred embodiment is presented in following paragraphs in combination with FIG. 9 through FIG. 14.

Figure 1:
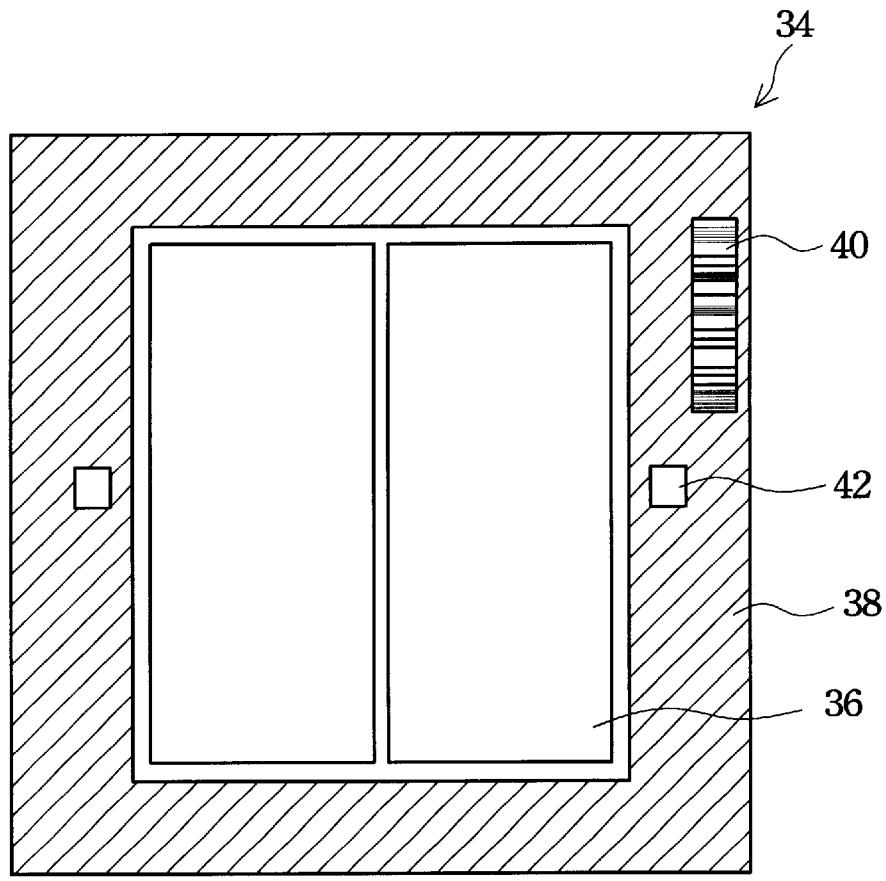
FIG. 1 is a top view of an attenuated phase-shifting mask.
Figure 2:
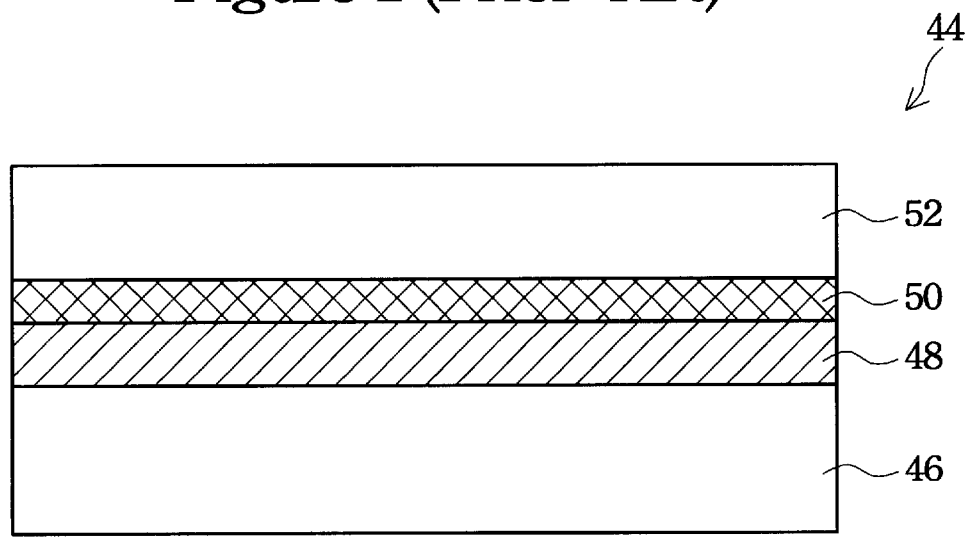
FIG. 2 is a cross-sectional view of an original phase-shifting mask provided by mask venders, in accordance with prior arts.
Figure 3:
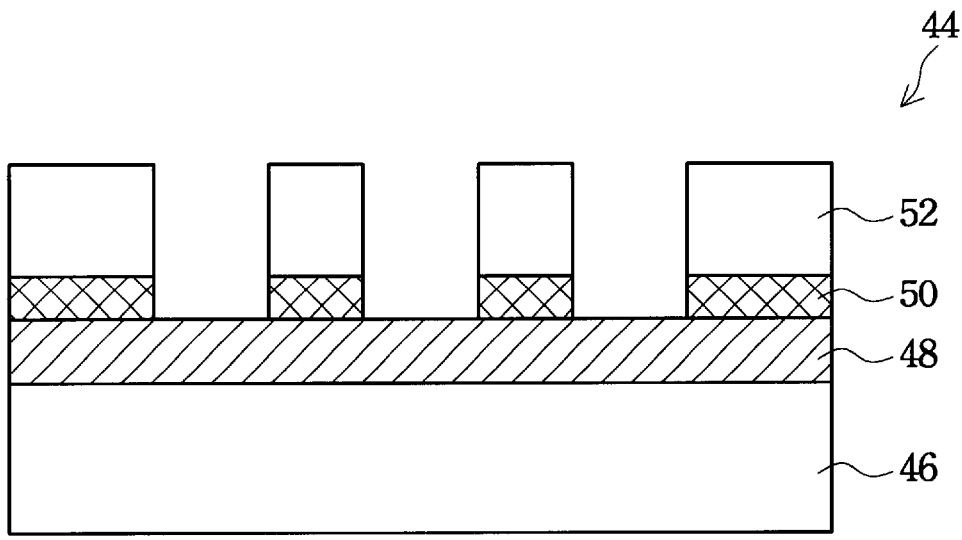
FIG. 3 is a cross-sectional view of etching an opaque layer by employing a first photoresist layer as an etching mask, in accordance with prior arts.
Figure 4:
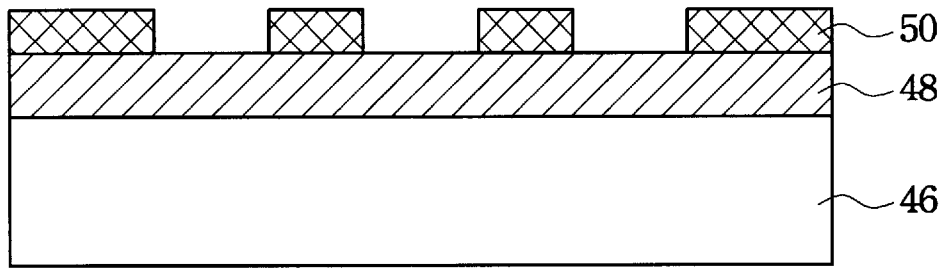
FIG. 4 is a cross-sectional view of stripping the first photoresist layer, in accordance with prior arts.
Figure 5:
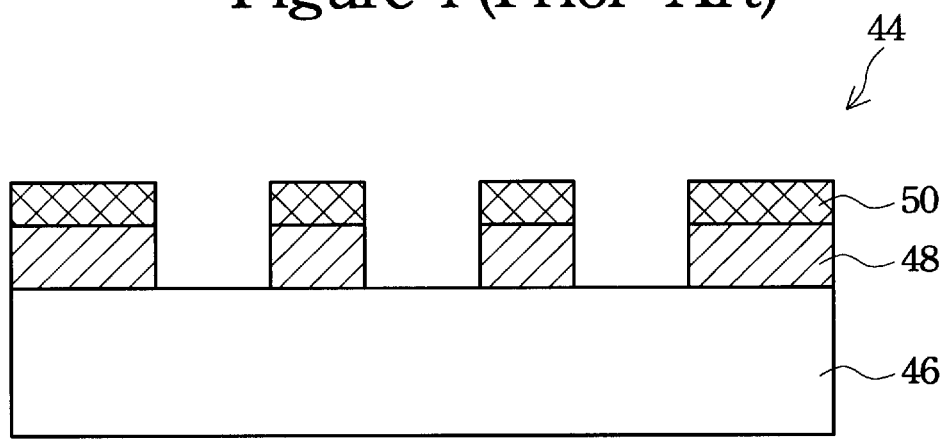
FIG. 5 is a cross-sectional view of etching a phase-shifting layer by employing the opaque layer as an etching mask, in accordance with prior arts.
Figure 6:
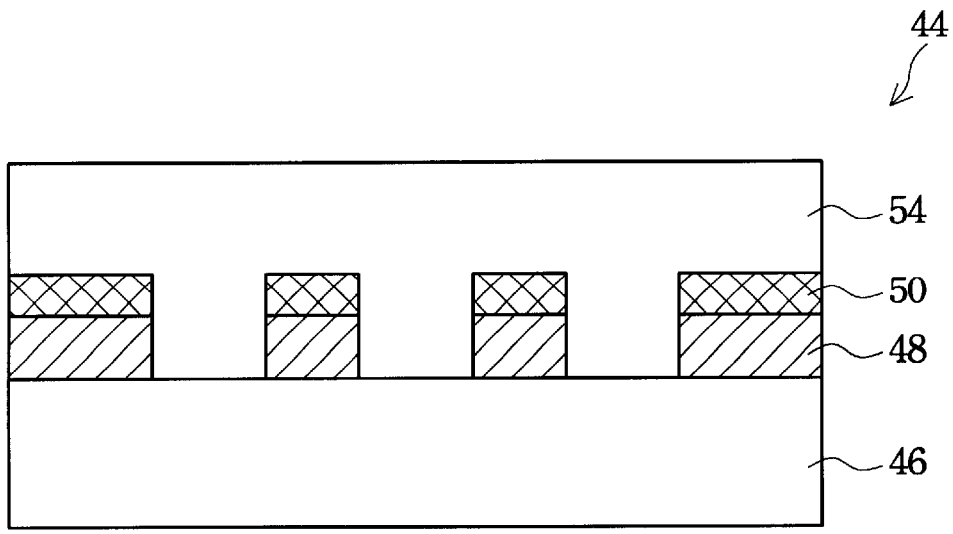
FIG. 6 is a cross-sectional view of coating a second photoresist layer on the original phase-shifting mask, in accordance with prior arts.
Figure 7:
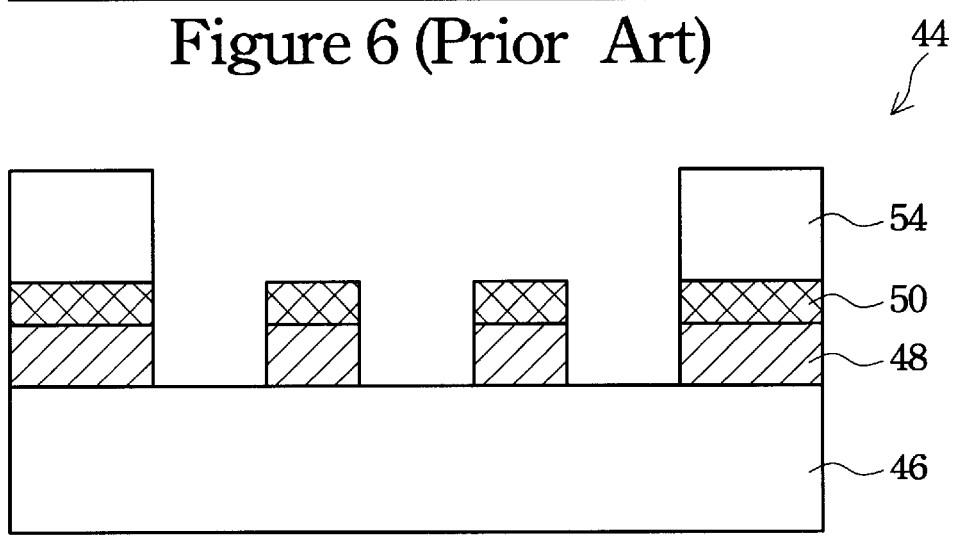
FIG. 7 is a cross-sectional view of removing parts of the second photoresist layer, in accordance with prior arts.
Figure 8:
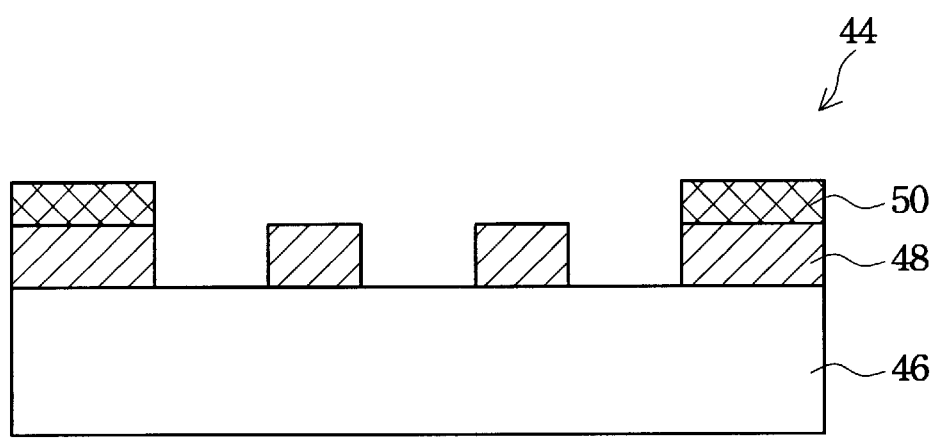
FIG. 8 is a cross-sectional view showing a complete attenuated phase-shifting mask, in accordance with prior arts.
Figure 9:
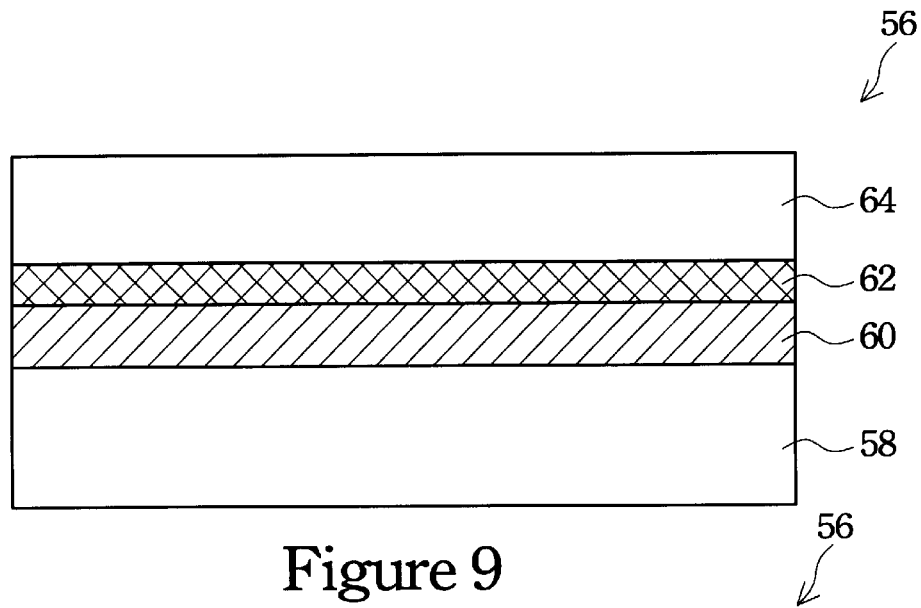
FIG. 9 is a cross-sectional view of an original attenuated phase-shifting mask provided by mask venders, in this invention.

FIG. 9 shows a cross-sectional view of an original attenuated phase-shifting mask 56 provided by mask vendors. The attenuated phase-shifting mask 56 is substantially formed by successively coating a phase-shifting layer 60, opaque layer 62, and photoresist layer 64 on a transparent plate 58. In this embodiment, the transparent plate 58 is made of quartz or glass in a thickness about 250 mil. The phase-shifting layer 60 is used to adjust phases of incident rays through the attenuated phase-shifting mask 56, thereby transforming its patterns to chips in accuracy. In this embodiment, the phase-shifting layer 60 is made of MoSiON in a thickness about 1350 A. As for the opaque layer 62, its function is for serving as a reflection region around the attenuated phase-shifting mask 56 to facilitate steppers to identify and locate the mask. In this preferred embodiment, the opaque layer is made of chromium in a thickness about 1050 A.

Figure 10:
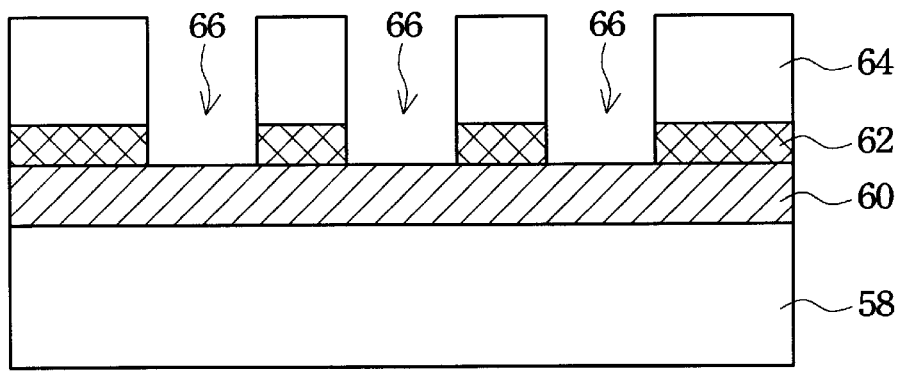
FIG. 10 is a cross-sectional view of etching an opaque layer by employing a photoresist layer as an etching mask, in this invention.

Referring to FIG. 10, the photoresist layer 64 is firstly exposed by light to define a first region 66. The first region 66 is then removed until exposing parts of the surface of opaque layer 60 by dipping the attenuated phase-shifting mask 56 into developer solution according to conventional development process. The exposed parts of opaque layer 62 are then removed until exposing parts of the phase-shifting layer 60 through a wet etching process by employing the photoresist layer 64 as an etching mask. In this embodiment, the opaque layer 62, i.e. chromium layer, is removed by $(NH_4)Ce(NO_3)_6$ through a conventional wet etching process, but could also be removed by $Cl_2$ plasma through a conventional dry etching process as an alternative.

Figure 11:
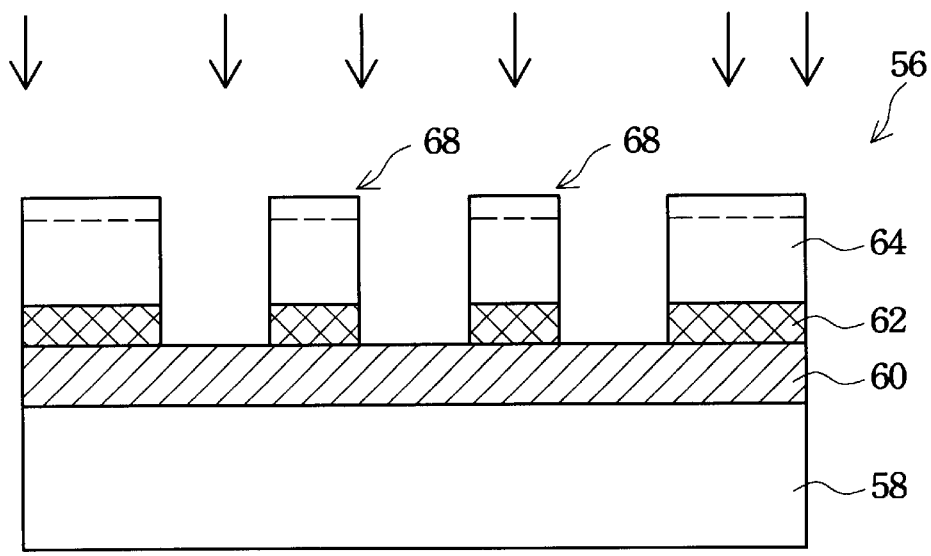
FIG. 11 is a cross-sectional view of treating a surface of the photoresist layer, in this invention.
Figure 12:
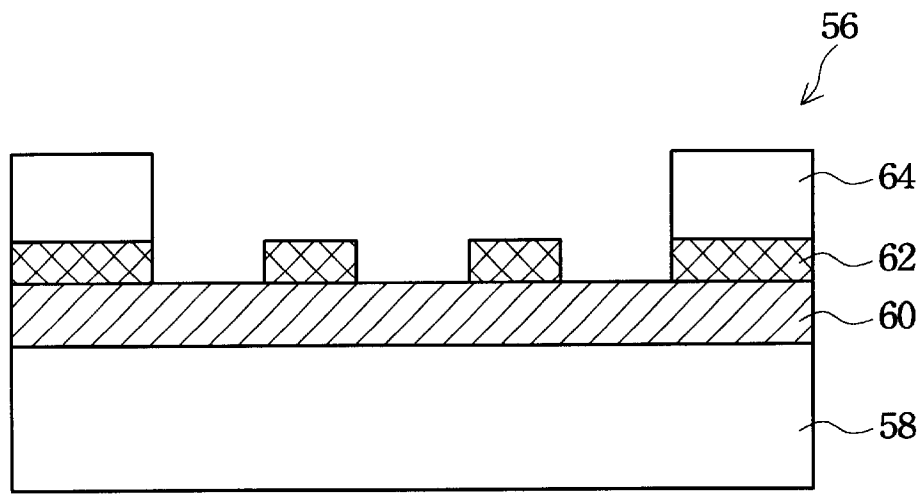
FIG. 12 is a cross-sectional view of removing parts of the photoresist layer, in this invention.

Referring to FIG. 11, the surface of photoresist layer 64 is treated by low-energy plasma to strip a thin layer form its top surface for further redefining the photoresist layer 64. After the photoresist layer 64 has been defined through the forgoing exposure and development, there is a thin solidified layer atop the photoresist layer 64. For recycling and redefining the photoresist layer 64, the solidified layer must be removed, and the second region 68 of the photoresist layer 64 could be removed by secondly exposing and developing the attenuated phase-shifting mask 56, as shown in FIG. 12. In this preferred embodiment, the solidified layer of photoresist layer 64 can be stripped to an approximate thickness between about 100~200 angstroms by relatively low-energy $O_2$ plasma treatment.

Figure 13:
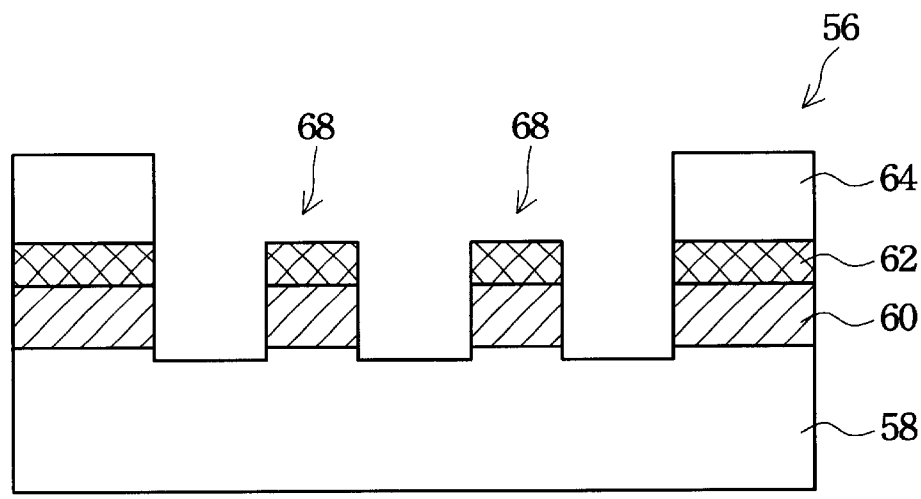
FIG. 13 is a cross-sectional view of etching the phase-shifting layer by employing the opaque layer as an etching layer, in this invention.
Figure 14:
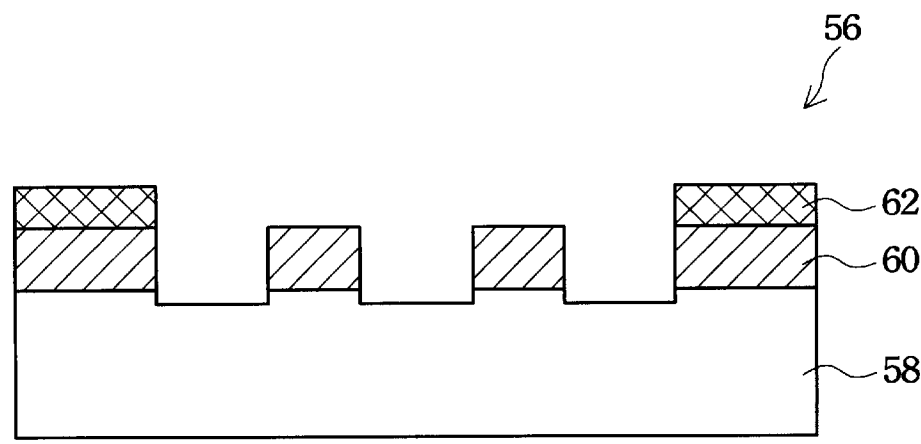
FIG. 14 is a cross-sectional view of removing the photoresist layer and parts of the opaque layer to form a complete attenuated phase-shifting mask, in this invention.

Referring to FIG. 13, parts of the phase-shifting layer 60 exposed out of the opaque layer 62 are removed until exposing part surfaces of the transparent plate 58 through an etching process by employing the opaque layer 62 as an etching mask. For adjust phases of incident rays through the attenuated phase-shifting mask 56, the exposed surfaces of transparent plate 58 are further slightly etched into it. In this embodiment, the phase-shifting layer 60, i.e. MoSiON layer, can be removed by $CF_4$ plasma through a dry etching process, and the transparent plate, such as quartz plate or glass plate, can be also etched by $CF_4$ plasma through a dry etching process. After the etching of transparent plate 58, the exposed opaque layer 62, namely the parts of the second region 68, and the photoresist layer 64 are successively stripped through conventional wet etching or dry etching process, thereby forming a complete attenuated phase-shifting mask 56 as shown in FIG. 14.

This invention simplifies the conventional process of forming attenuated phase-shifting mask, which needs complicated steps to form two photoresist layers, thereby raising the yield rates as well as decreasing the cost. In realistic applications, by this invention, semiconductor manufacturers are able to avoid to coat photoresist layers by themselves. Thus, the problems due to coating masks with photoresist materials, such as uneven contour of photoresist layer at corners of the mask, are overcome because this invention enables semiconductor manufacturers bypass coating photoresist materials by themselves.

As is understood by a person skilled in the art, the foregoing preferred embodiments of the present invention that are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for forming an attenuated phase-shifting mask utilizing a single undeveloped photoresist layer, which comprises:

provlding a transparent plate, a phase-shifting layer, an opaque layer, and an undeveloped photoresist layer being stacked on the transparent plate successively;

removing a first part of the photoresist layer for exposing a first region of the opaque layer;

removing the first region of the opaque layer for partially exposing the phase-shifting layer;

then removing a second part of the photoresist layer for exposing a second region of the opaque layer;

etching the phase-shifting layer until exposing a surface of the transparent plate by employing the opaque layer as an etching mask;

removing the second region of the opaque layer exposed out of the remaining photoresist layer; and then removing the remaining photoresist layer for forming the attenuated phase-shifting layer with the opaque layer partially coated on the transparent plate.

2. The method of claim 1, further comprising the following steps before removing a first part of the photoresist layer:

exposing the photoresist layer for defining the first region; and then first developing the photoresist layer.

3. The method of claim 2, further comprising the following steps before removing the second part of the photoresist layer:

treating a surface of the photoresist layer for removing a solidified layer atop the photoresist layer through the step of first developing;

exposing the photoresist layer; and then developing the photoresist layer.

4. The method of claim 3, wherein the step of treating a surface is a dry etching process by $O_2$ plasma.

5. The method of claim 3, wherein the solidified layer has a thickness in between about 100~200 angstroms.

6. The method of claim 1, wherein, before removing the second region of the opaque layer exposed out of the remaining photoresist layer, further comprising a step of etching the transparent plate exposed out of the opaque layer for adjusting a shifting phase of an incident light through the transparent plate.

7. The method of claim 1, wherein the opaque layer is chromium, which is removed by $(NH_4)Ce(NO_3)_6$ through a wet etching process.

8. The method of claim 1, wherein the phase-shifting layer is MoSiON.

9. The method of claim 1, wherein the MoSiON is removed by $Cl_2$ plasma through a dry etching process.

10. The method of claim 1, wherein the opaque layer is partially formed around the attenuated phase-shifting mask to facilitate a stepper for identifying and locating the attenuated phase-shifting mask after the step of removing the remaining photoresist layer.

11. A method for forming an attenuated phase-shifting mask utilizing a single undeveloped photoresist layer, which comprises:

providing a transparent plate, a phase-shifting layer, an opaque layer, and an undeveloped photoresist layer being stacked on the transparent plate successively;

first exposing the photoresist layer for defining a first region of the opaque layer;

first developing the photoresist layer;

removing the first region of the opaque layer for partially exposing the phase-shifting layer;

treating a surface of the photoresist layer for removing a solidified layer atop the photoresist layer through the step of first developing the photoresist layer;

secondly exposing the photoresist layer;

secondly developing the photoresist layer for exposing a second region of the opaque layer;

etching the phase-shifting layer until exposing a surface of the transparent plate by employing the opaque layer as an etching mask;

removing the second region of the opaque layer exposed out of the photoresist layer; and thirdly removing the remaining photoresist layer for forming the attenuated phase-shifting layer with the opaque layer partially coated on the transparent plate.

12. The method of claim 11, wherein the step of treating a surface is a dry etching process by $O_2$ plasma.

13. The method of claim 11, wherein the solidified layer has a thickness in between about 100~200 angstroms.

14. The method of claim 11, before removing the second region of the opaque layer exposed out of the photoresist layer further comprising a step of etching the transparent plate exposed out of the opaque layer for adjusting a shifting phase of an incident light through the transparent plate.

15. The method of claim 11, wherein the opaque layer is chromium, which is removed by $(NH_4)Ce(NO_3)_6$ through a wet etching process.

16. The method of claim 11, wherein the phase-shifting layer is MoSiON.

17. The method of claim 16, wherein the MoSiON is removed by $Cl_2$ plasma through a dry etching process.

18. The method of claim 11, wherein the opaque layer is partially formed around the attenuated phase-shifting mask to facilitate a stepper for identifying and locating the attenuated phase-shifting mask after the step of thirdly removing.

* * * * *